(12) United States Patent
Feng

(10) Patent No.: US 10,853,549 B2
(45) Date of Patent: Dec. 1, 2020

(54) METHOD AND APPARATUS FOR SIMULATING THE GENERATED CHARGE PROFILE OF PIEZOELECTRIC ELEMENTS DUE TO ARBITRARY SHOCK LOADING

(71) Applicant: Ziyuan Feng, Ronkonkoma, NY (US)

(72) Inventor: Ziyuan Feng, Ronkonkoma, NY (US)

(73) Assignee: OMNITEK PARTNERS LLC, Ronkonkoma, NY (US)

( * ) Notice: Subject to any disclaimer, the term of this patent is extended or adjusted under 35 U.S.C. 154(b) by 362 days.

(21) Appl. No.: 15/659,548

(22) Filed: Jul. 25, 2017

(65) Prior Publication Data
US 2018/0032656 A1    Feb. 1, 2018

Related U.S. Application Data

(60) Provisional application No. 62/367,074, filed on Jul. 26, 2016.

(51) Int. Cl.
  *H01L 41/04*   (2006.01)
  *G06F 30/367*   (2020.01)
  *H02N 2/18*   (2006.01)
  *H01L 41/113*   (2006.01)

(52) U.S. Cl.
  CPC .......... *G06F 30/367* (2020.01); *H01L 41/042* (2013.01); *H01L 41/1132* (2013.01); *H02N 2/181* (2013.01)

(58) Field of Classification Search
  CPC ............................ G06F 17/5036; H01L 41/042
  USPC ......................................................... 310/317
  See application file for complete search history.

(56) References Cited

U.S. PATENT DOCUMENTS

| | | | | |
|---|---|---|---|---|
| 4,404,502 A | * | 9/1983 | Magori | ................. B06B 1/0215 310/323.21 |
| 2007/0296307 A1 | * | 12/2007 | Fukagawa | ........... F02D 41/2096 310/316.03 |
| 2014/0070665 A1 | * | 3/2014 | Muggler | ................... G06F 1/32 310/314 |

* cited by examiner

*Primary Examiner* — Derek J Rosenau

(57) ABSTRACT

A piezoelectric open-circuit output voltage profile simulator including a capacitor; at least first, second and third switches; and a controller for controlling the first, second and third switches.

14 Claims, 10 Drawing Sheets

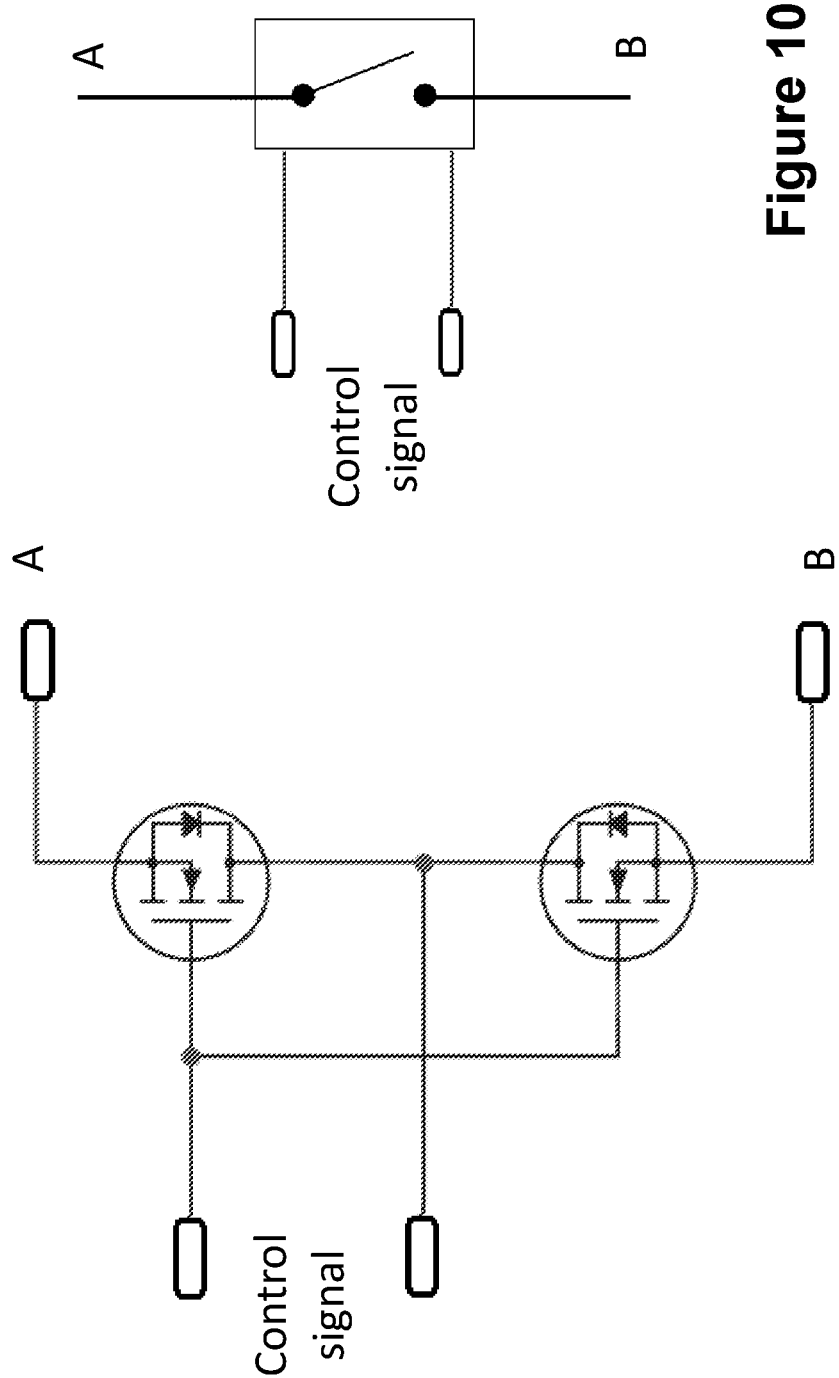

METHOD AND APPARATUS FOR SIMULATING THE GENERATED CHARGE PROFILE OF PIEZOELECTRIC ELEMENTS DUE TO ARBITRARY SHOCK LOADING

CROSS-REFERENCE TO RELATED APPLICATION

This application claims the benefit of U.S. Provisional Application No. 62/367,074 filed on Jul. 26, 2016, the entire contents of which is incorporated herein by reference.

BACKGROUND

1. Field

The present disclosure relates generally to methods for the design of electronic simulators that can simulate the profile of the level of charges generated when a piezoelectric element is subject to shock loading and to a related apparatus. The present disclosure is more particularly related to simulators that can simulate the profile of the level of charges generated by piezoelectric elements used in munition during firing or target impact.

2. Prior Art

Pulsed loading of piezoelectric transducers occurs in many applications such as those in munitions firing or when a mechanical system is subjected to impact type loading and is used to generate electrical energy. In such cases, the charges generated by the piezoelectric transducer are typically short lived and proper electronic circuitry has to be developed that could collect the generated charges and condition it for use by the system or device to be powered and/or for storage in an appropriate electrical energy storage device such as a rechargeable battery or a capacitor or the like. In many applications, such impulsive shock loading events occurs only once. Such events are generally referred to as "one-shot" events, examples of which include car accident impacts or munitions explosion or gun firing or target impact. In many other applications, impulsive shock loading event consist of continuously occurring and relatively short duration shock loading pulses that may occur at regularly or randomly spaced time.

In many applications, piezoelectric-based devices are provided to generate electrical energy once the intended shock loading event occurs, that is function as a so-called energy harvester to convert mechanical energy to electrical energy, and fully power the device function, i.e., render the device self-powered. Examples of such devices include self-powered shock loading event detection with integrated safety logic for pyrotechnic initiation and switching in munitions are disclosed in U.S. Pat. Nos. 9,194,681; 9,097,502; 9,021,955; 8,776,688; and 8,677,900, the entire contents of which is incorporated herein by reference. Other examples include self-powered sensors to impact of the host with an object; sensors to detect pressure waves or short duration acceleration or deceleration shock loading due to detonation of explosives such as experienced in mining activities; and the like.

Piezoelectric transducers have also been used in mass-spring type of energy harvesting devices that are designed to generate electrical energy from shock loadings. In these devices, shock loading transfers mechanical energy to the mass-spring element of the energy harvesting device in the form of potential energy in the spring component and kinetic energy in the mass component of the energy harvesting device. The piezoelectric transducer component of the device is then used to convert the transferred mechanical energy to electrical energy as the mass-spring vibrates. Such piezoelectric-based energy harvesting devices for use in gun-fired munitions, mortars and the like are well known in the art, such as at Rastegar, J., Murray, R., Pereira, C., and Nguyen, H-L., "Novel Piezoelectric-Based Energy-Harvesting Power Sources for Gun-Fired Munitions," *SPIE 14th Annual International Symposium on Smart Structures and Materials* 6527-32 (2007); Rastegar, J., Murray, R., Pereira, C., and Nguyen, H-L., "Novel Impact-Based Peak-Energy Locking Piezoelectric Generators for Munitions," *SPIE 14th Annual International Symposium on Smart Structures and Materials* 6527-31 (2007); Rastegar, J., and Murray, R., "Novel Vibration-Based Electrical Energy Generators for Low and Variable Speed Turbo-Machinery," *SPIE 14th Annual International Symposium on Smart Structures and Materials* 6527-33 (2007). Rastegar, J., Pereira, C., and H-L.; Nguyen, "Piezoelectric-Based Power Sources for Harvesting Energy from Platforms with Low Frequency Vibration," *SPIE 13th Annual International Symposium on Smart Structures and Materials* 6171-1 (2006).

In all piezoelectric-based energy harvesting devices and particularly in aforementioned and other similar applications in which the piezoelectric element of the device is intended to generate electrical energy in response to short duration shock loading, proper design of the charge (electrical energy) collection and conditioning circuit is critical for achieving high mechanical to electrical energy conversion efficiency. High mechanical to electrical energy conversion is essential since piezoelectric transducers generate very small amount of electrical energy, usually in the order of micro-Joules for a transducer of 30-40 cubic millimeters. Thus, to minimize the relative size of the piezoelectric element for a given application, which would also reduce the required shock loading level (corresponding to the resulting strain level that needs to be applied to the piezoelectric element), the efficiency of the charge collection and conditioning electronics must be maximized.

Design of aforementioned efficient charge collection and conditioning circuits is particularly challenging in applications such as gun-fired munitions which require additional safety features to prevent accidental powering of the devices being powered, such as their initiation devices.

Currently, the collection and conditioning circuit designer can test the circuit design either by computer modeling and simulation of the circuit or by using the output of the actual piezoelectric-based device and subjecting it to the actual shock loading or the like event that it is designed to be subjected to. The computer modeling and simulation process is particularly useful to the circuit designer while developing the basic circuit design since components and design variables can be quickly changed or modified in the pursuit of more optimal circuit performance. Thus, computer modeling and simulation process is very helpful to the circuit designer at the early stages of the circuit development efforts but due to unavoidable effects of approximations and idealizations of the component used in the circuits and the neglected effects of nonlinearities, cross-sensitivities, connecting wires and connectors, and many other factors that are either idealized or approximated or totally ignored while modeling a complex system, the results of simulation of computer models is generally good only up to certain limits. Therefore, after all computer simulation efforts have been exhausted, the circuit designer has to test the performance of the developed collection and conditioning circuit together with the intended device or system to be powered. Such performance tests are necessary since they would provide realistic performance information that can then be used to vary and/or modify the design and/or its parameters and/or components to achieve optimal performance. In many system design efforts, the piezoelectric-based device and possibly the system or device to be powered may also have to be modified to achieve optimal overall system performance.

SUMMARY

A need therefore exists for electronic apparatus that would simulate the electrical energy (charges) that is generated by piezoelectric-based devices such as piezoelectric-based energy harvesting devices or by piezoelectric-based event detection sensors used for detecting gun-firing setback acceleration or impact induced shock loading events in munitions. Such piezoelectric-based device output simulators are particularly needed so that the designer of a device or system that utilizes the piezoelectric-based device as a source of electrical energy and/or as a sensor for detecting events such as shock loading can test the developed device or system under close to realistic conditions without requiring the highly costly and time consuming process of integrating it into the intended receiving system to test for its performance.

A need also exists that the electronic piezoelectric-based device output simulator be capable of being programmed to provide close to realistic outputs so that the designer of the aforementioned charge collection and conditioning circuits as well as the system or device that is to be powered and/or provided with the said event detection sensory inputs can use to test the developed device or system in a close to realistic conditions without having to follow the costly and time consuming process of developing fully integrated systems and testing, which must in general be repeated many times to achieve more optimal and reliable results.

A need also exists for methods for the design of electronic apparatus that would simulate the generated energy (charge) profile of piezoelectric transducers as they are subjected to various input loading. Such piezoelectric-based device output simulators are needed so that the designer of a device or system that utilizes the piezoelectric-based device as a source of electrical energy and/or as a sensor for detecting events such as shock loading can test the developed device or system under close to realistic conditions without requiring the highly costly and time consuming process of integrating it into the intended receiving system to test for its performance. The simulator must be capable of being programmed to generate a wide range of outputs that piezoelectric-based devices may generate under actual conditions.

Accordingly, methods and apparatus are provided that can simulate the electrical energy (charges) that is generated by piezoelectric-based devices such as piezoelectric-based energy harvesting devices or by piezoelectric-based event detection sensors used for detecting gun-firing setback acceleration or impact induced shock loading events in munitions. The simulator is programmable to provide varieties of output profiles that are expected during different shock loading events.

BRIEF DESCRIPTION OF THE DRAWINGS

These and other features, aspects, and advantages of the apparatus of the present invention will become better understood with regard to the following description, appended claims, and accompanying drawings where:

FIGS. 10A and 10B illustrate another possible implementation of the switches SW1, SW2, and SW3 of the embodiment of FIG. 5 and similar switches of added circuits 31 of FIG. 7 using a pair of N-MOSFETs.

DETAILED DESCRIPTION OF THE PREFERRED EMBODIMENT

Figure 1:
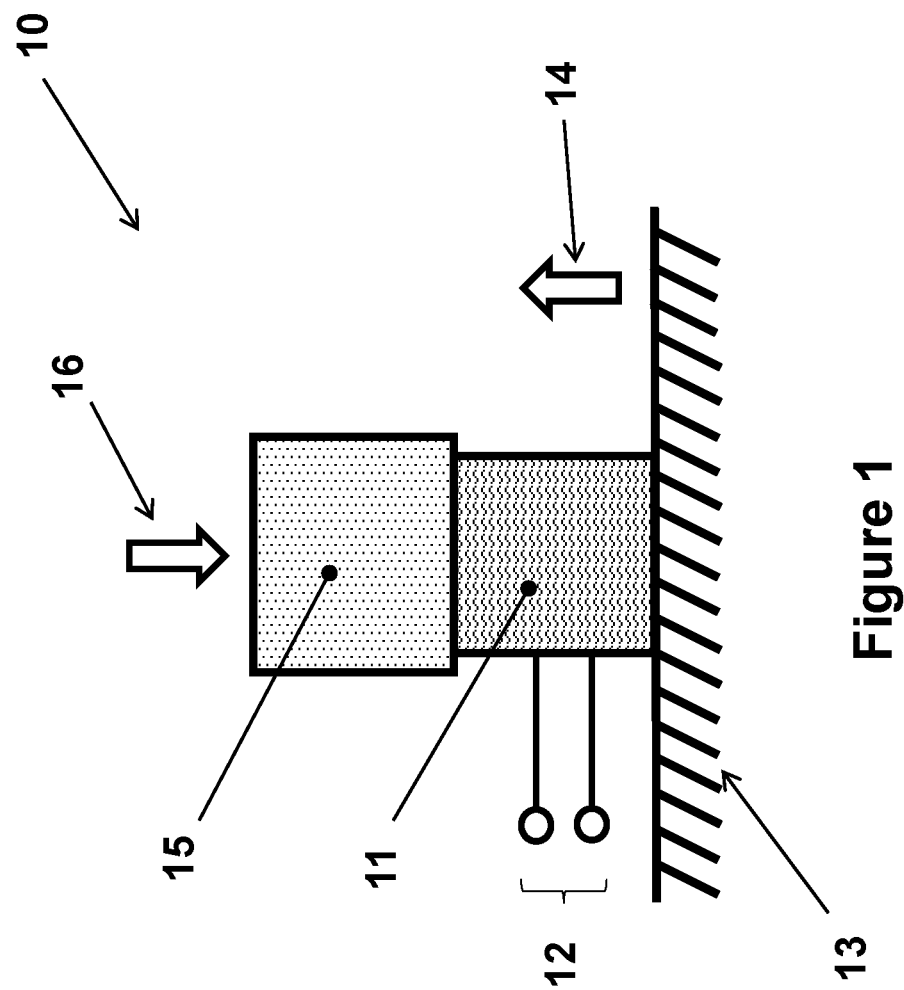
FIG. 1 illustrates a typical piezoelectric-based electrical energy generator component of a self-powered device that is intended to generate electrical energy when subjected to shock loading due to an acceleration pulse.

A typical piezoelectric electrical energy generator 10, usually with a stack type piezoelectric element 11, that is used in self-powered devices to generate electrical energy when the device is subjected to shock loading, for example due to an acceleration pulse, is shown in the schematic of FIG. 1. In the configuration shown in FIG. 1, the piezoelectric electrical energy (charge) generator 10 is shown as rigidly attached to a base structure 13, which is considered to be subjected at certain point in time to an acceleration pulse in the direction of the arrow 14. A relatively rigid mass 15 may also be required to react to the acceleration 14 and apply a resulting compressive force to the piezoelectric element 11. Then because of the compressive force and the internal normal compressive pressure generated in the piezoelectric element 11 due to its own mass because of the acceleration, the piezoelectric element 11 is strained axially, and thereby generates electrical charges at its electrodes as is well known in the art. The leads 12, properly connected to the electrodes of the piezoelectric element, would make the generated charges available for collection and conditioning.

In a typical piezoelectric-based self-powered device application, a piezoelectric electrical energy generator similar to the one shown in FIG. 1 is used to provide electrical energy (charges) to a properly designed collection and conditioning circuit, which would then power the device. In the present case, the piezoelectric electrical energy generator is considered to generate electrical energy because of a shock-loading event due to the aforementioned acceleration pulse. The piezoelectric electrical energy generator 10 is thereby functioning as a so-called energy harvester to convert mechanical energy to electrical energy, and power the self-powered device. Examples of such self-powered devices include shock loading event detection with integrated safety logic for pyrotechnic initiation and switching in munitions.

It is appreciated by those skilled in the art that shock loading pulse applied to the piezoelectric element 11 of the piezoelectric electrical energy generator 10 may also be due to direct application of a compressive force shown by the arrow 16 in FIG. 1. The applied compressive force may be the result of impact with an object, a pressure wave, or the like.

Figure 2:
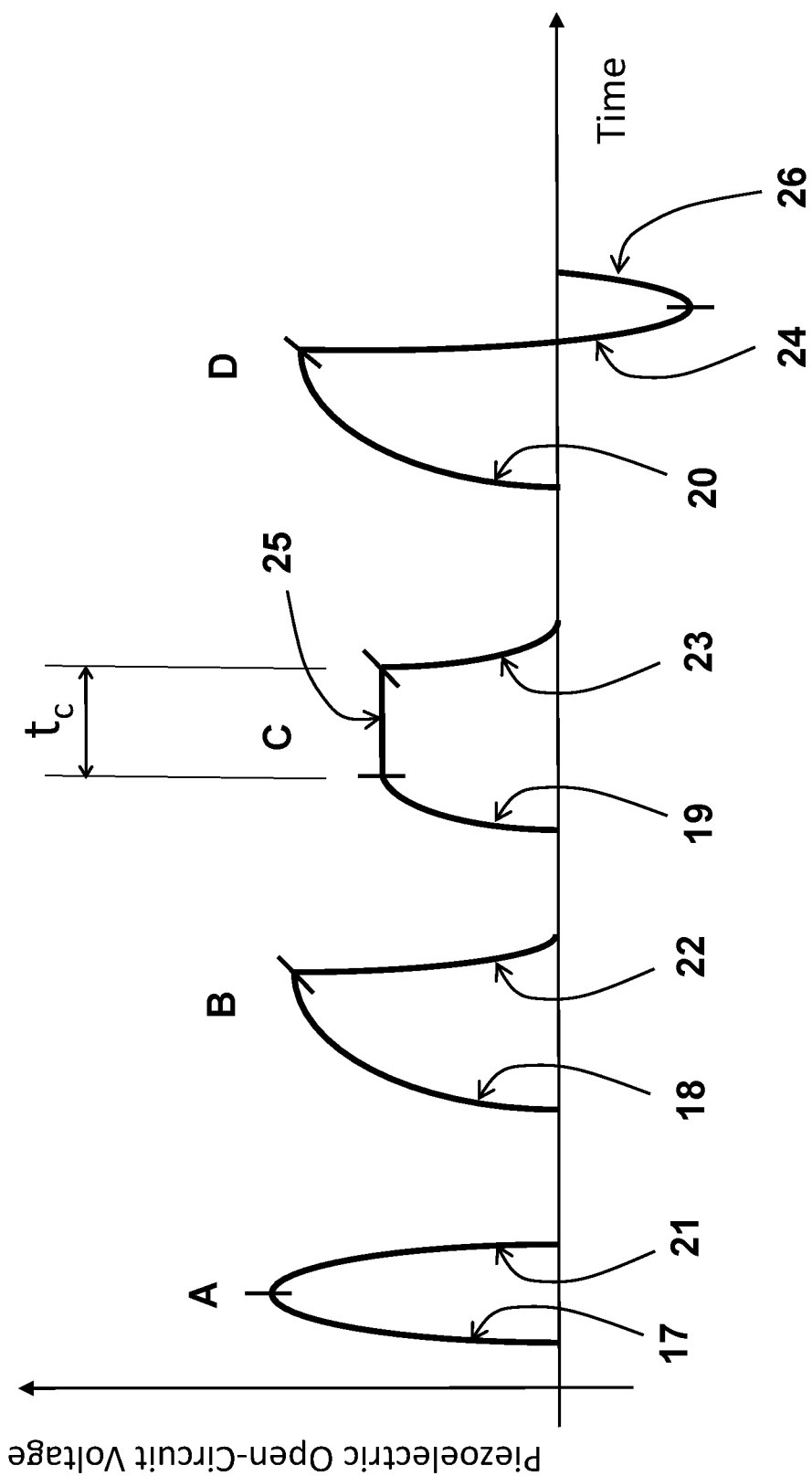
FIG. 2 illustrates the profiles of the most expected piezoelectric open-circuit output voltage profiles that are generated by a typical piezoelectric electrical energy generator shown in FIG. 1, in response to various shock loading profiles.

FIG. 2 illustrates typical profiles of the most expected piezoelectric open-circuit output voltage profiles (waveforms) that are generated by a typical piezoelectric electrical energy generator 10 in response to various aforementioned shock loading profiles. The piezoelectric element generated charge profile simulator embodiments are intended to be readily programmed and configured to generate these and other similar piezoelectric open-circuit output voltage profiles.

Each expected piezoelectric open-circuit output voltage profiles may be divided into mostly two or three and sometimes more different sections. For example, the profiles A, B, C and D shown in FIG. 2 may be divided into voltage rise sections 17, 18, 19 and 20, respectively, and voltage fall sections 21, 22, 23 and 24, respectively, for the profiles A, B, C and D. The profile C is also seen to have a constant voltage section 25, and the profile D having a second voltage rise section 26. It is also appreciated by those skilled in the art that any one or more of the voltage profiles shown in FIG. 2 or other similar profiles may be repeated two or more times every relatively short or long time periods apart. The open-circuit voltage outputs A, B and C are shown to be positive, but as is appreciated by those skilled in the art may also be negative. In addition, the peak of the negative voltage portion of the profile D of FIG. 2 is shown to be smaller than that of the positive portion since piezoelectric elements are generally desired to be subjected mostly to compressive loading due to their brittle nature. However, the piezoelectric elements have been preloaded in compression as assembled in the intended device so that they could be subjected to significant tensile loading.

Figure 3:
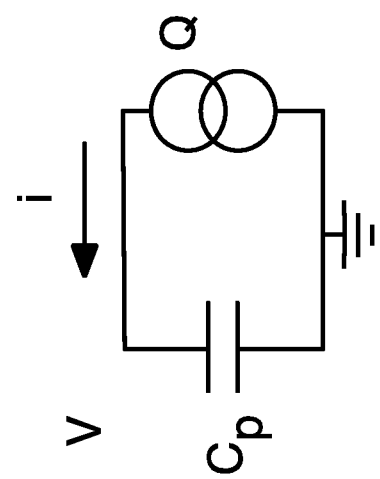
FIG. 3 illustrates a model of a piezoelectric element used in the disclosed embodiments for generating electrical charges for harvesting and sensing when subjected to external loading.

A stand-alone piezoelectric (usually in stack form) element can be modeled as a capacitor $C_p$ connected in parallel to a charge source Q as shown in FIG. 3. The charge source Q generates charge proportional to the axial (normal) strain of the piezoelectric element as it is subjected to axial (normal) loading, and thereby sends the charge as current i to the capacitor $C_p$ of the piezoelectric element. The charges accumulated on the capacitor $C_p$ produces a voltage V, which is the aforementioned so-called open-circuit voltage of the piezoelectric element. When the piezoelectric element is connected to another circuitry, the generated charge and current are the same, but due to the resulting charge exchange with the other circuitry, the in circuit voltage of the piezoelectric element may be different from the open circuit voltage V.

Figure 4:
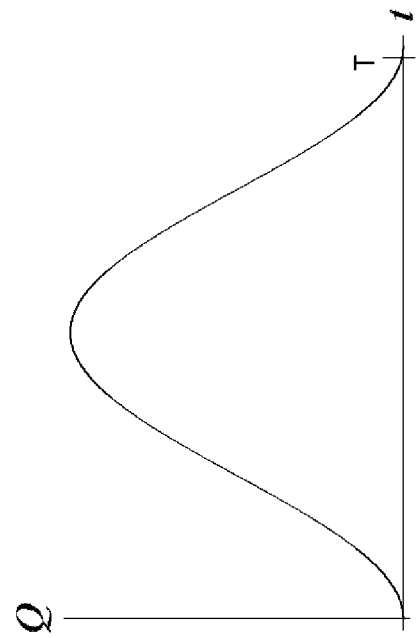
FIG. 4 is a plot of the generated piezoelectric charge as a function time during a typical short duration shock loading (impact) pulse loading.

A typical plot of the profile of the charge level on the piezoelectric element (FIG. 3) as it is subjected to a short duration impact loading as a function of time is shown in FIG. 4. The maximum amount of charges Q (in Coulomb) is dependent on the size of the piezoelectric element and the applied impact force levels. In most cases of interest, the impact loading duration may be as low as 10-100 microseconds.

Figure 5:
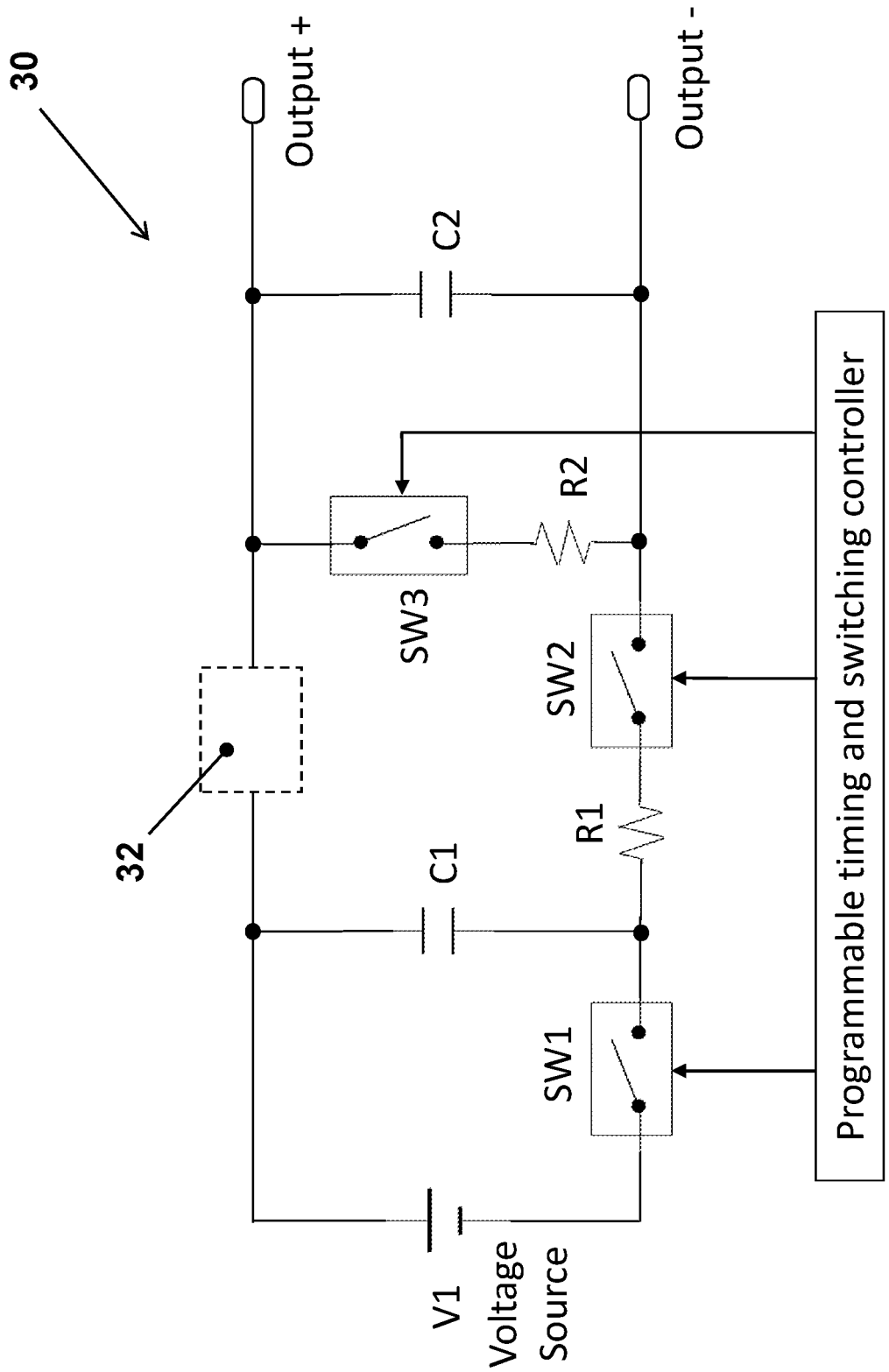
FIG. 5 illustrates the basic circuit of the first embodiment of the programmable piezoelectric element generated charge profile simulator of the present invention.

FIG. 5 shows a circuit of a first embodiment 30 of the programmable piezoelectric element generated charge profile simulator. In the circuit of FIG. 5, capacitance of the capacitor C2 is selected to be equal to the capacitance of the piezoelectric element 11 of the piezoelectric electrical energy generator 10, the open-circuit output of which is to be simulated by the programmable piezoelectric element generated charge profile simulator 30. The basic circuit embodiment 30 uses at least three electronic switches that are controlled by the indicated "programmable timing and switching controller", FIG. 5, which may be constructed by a programmable microprocessor based system with internal clock as is well known in the art for performing such control functions. The designs of electronic switches that can be used for the switches SW1, SW2 and SW3 are also well known in the art, an example of which is described later in this disclosure. In FIG. 5, the indicated voltage source is considered to be capable of supplying the required electrical energy to charge the capacitor C1 to the indicated voltage level of V1.

Figure 6:
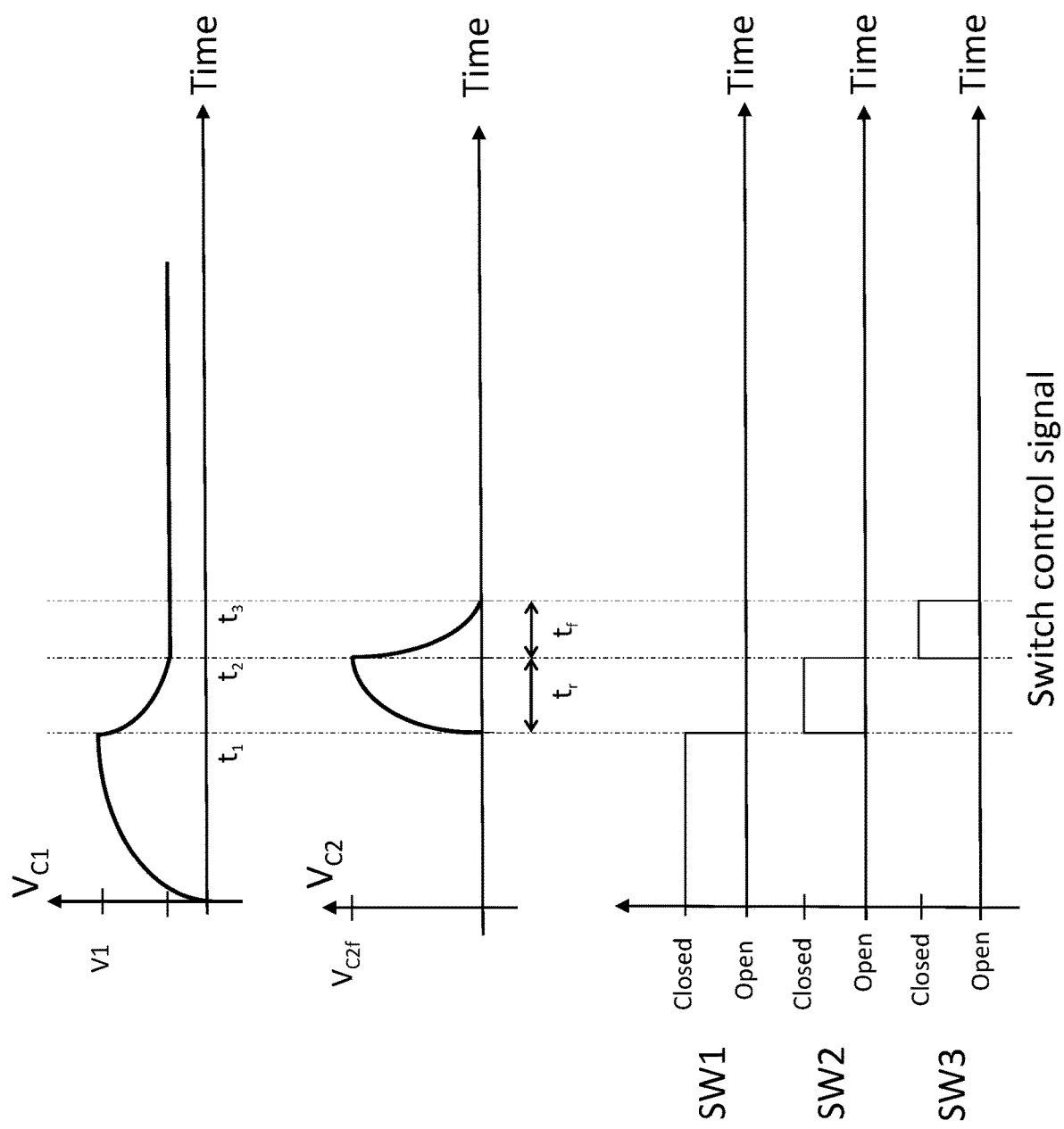
FIG. 6 illustrates the switching sequence and timing for the circuit of FIG. 5 to generate a piezoelectric element charge profile of the type B shown in FIG. 2.

An example of the general process of generating a desired piezoelectric open-circuit output voltage profile using the circuit embodiment 30 of FIG. 5 is described for the profile B of FIG. 2. In this case, the piezoelectric open-circuit output voltage profile is generated following the switching sequence and timing shown in FIG. 6. At the time t=0, indicated by the origin of the voltage-time plots of FIG. 6, the switch SW1 is closed until at time $t=t_1$ the capacitor C1 is charged to the voltage V1. During this time, the switches SW2 and SW3 are open. In FIG. 6, the state of the switches SW1, SW2 and SW3 are shown in the diagram below. At this time, the switch SW1 is opened and the switch SW2 is closed, while keeping the switch SW3 open. At this time $t=t_1$, the capacitor C1 begins to charge the capacitor C2 through the resistor R1 for a time period of $t_r$, i.e., the desired rise time of the piezoelectric open-circuit output voltage profile. At this time $t=t_2$, the capacitor C2 is charged to the intended piezoelectric open-circuit output voltage, indicated as $V_{c2f}$ in FIG. 6. It is appreciated by those skilled in the art that the voltage V1 has to be higher than the voltage $V_{c2f}$ by a certain amount depending on the capacitance of the capacitor C1 and that of capacitor C2. In general, the capacitance of the capacitor C1 is selected to be significantly larger than the largest piezoelectric element capacitance C1 that is expected to simulate. To achieve the voltage $V_{c2f}$ within the desired rise time of $t_r$, the initial voltage V1 of the capacitor C1 and the resistance of the resistor R1, i.e., the time constant of the R1, C1 and C2 circuit must be properly selected. In the first embodiment 30 of the programmable piezoelectric element generated charge profile simulator of FIG. 5, the "programmable timing and switching controller" component of the simulator can be programmed to calculate and set the required voltage V1 and resistance R1. In a simpler simulator, the user may have to calculate the values and manually set the voltage level V1 and install the proper resistor or a combination thereof to achieve the desired voltage $V_{c2f}$ within the desired rise time of $t_r$.

Then at time $t=t_2$, the switch SW2 is opened and the switch SW3 is closed for the desired period of time $t_f$ during which the open-circuit voltage of the piezoelectric element is to drop to zero, or in practice below a certain voltage at which the amount of charges remaining in the relatively small capacitor is effectively negligible. The stored charges in the capacitor C2 is discharged through the resistor R2 and the rate of discharge is determined by the time constant of the R2 and C2 circuit.

The piezoelectric open-circuit output voltage profile simulator embodiment 30 of FIG. 5 can generate the voltage profile B shown in FIG. 2. The "programmable timing and switching controller" of the piezoelectric open-circuit output voltage profile simulator embodiment 30 can be readily programmed to generate the open-circuit output voltage profile C shown in FIG. 2. This is accomplished by simply allowing a time period $t_c$ corresponding to the period during which the open-circuit output voltage is to stay constant, FIG. 2, is elapsed after the switch SW2 is opened (at time $t_1$, FIG. 6) and the switch SW3 is closed. It is appreciated by those skilled in the art that the time duration $t_c$ is in general only a few milliseconds, and by using a low leakage capacitor, the drop in the voltage of the capacitor C2 is negligible.

The piezoelectric open-circuit output voltage profile simulator embodiment 30 of FIG. 5 can usually generate only a single voltage profile B or C shown in FIG. 2, before the capacitor C1 is again charged to the required voltage V1. Thus, if the spacing between the desired multiple voltage profiles and the amount of charges to be transferred to the capacitor C1 do not allow the generation of multiple voltage profiles, then a number of solutions may be implemented, including the following.

The first solution is to increase the capacitance of the capacitor C1 and/or its charging voltage V1 so that while the capacitor C2 is being discharged, i.e., after the switch SW2 is opened and the switch SW3 is closed, the switch SW1 is also closed and allowed to further charge the capacitor C1. With this solution, the increase in the amount of capacitance of the capacitor C1 and the charging voltage V1 should be selected such that the amount of energy drained from the capacitor C1 during the highest energy charging of the capacitor C2 can be replenished during the shortest time periods between multiple open-circuit profile generation events, while considering all unavoidable losses of the process.

Figure 7:
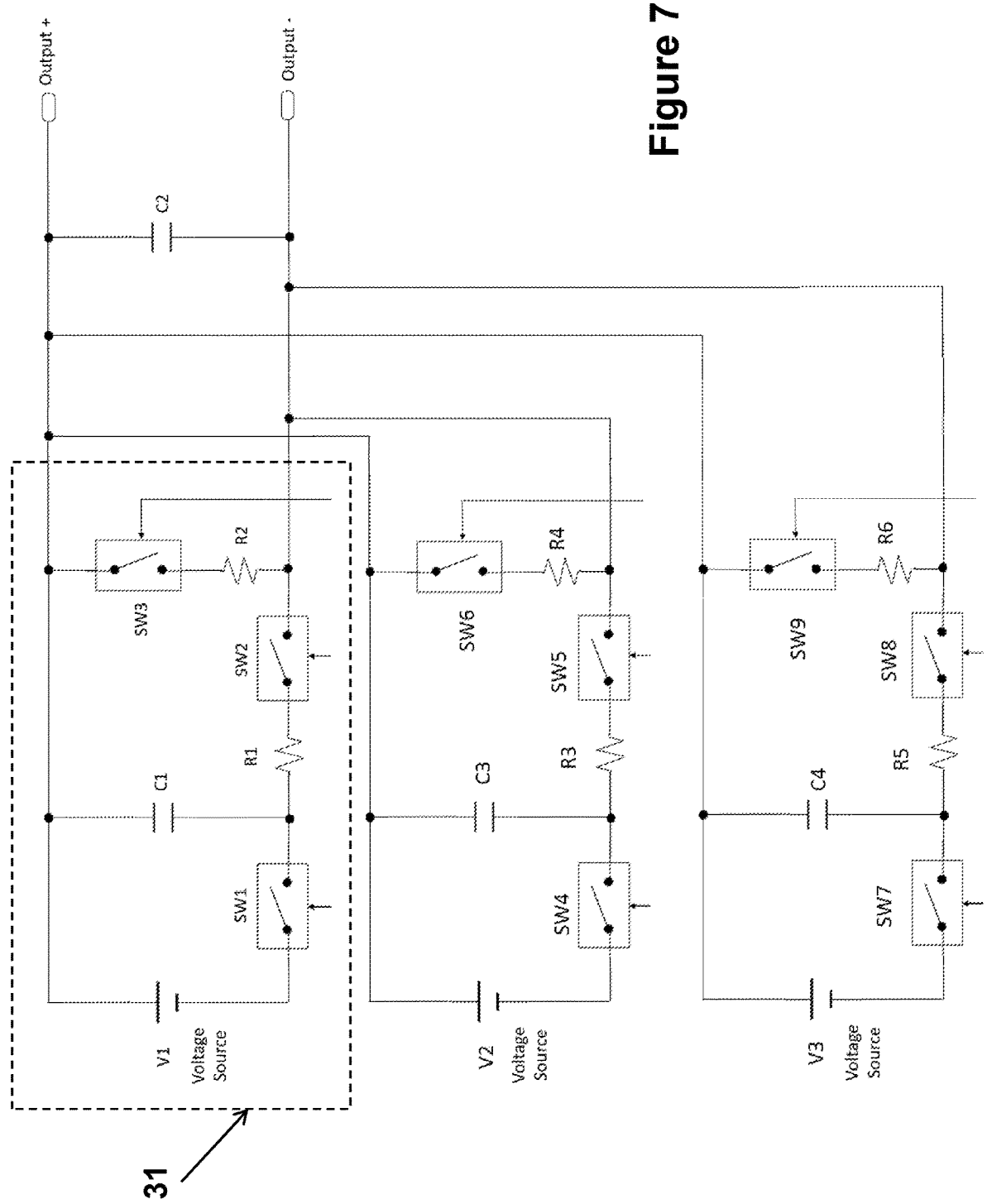
FIG. 7 illustrates the basic circuit of the first embodiment of the programmable piezoelectric element generated charge profile simulator of FIG. 5 with multiple circuits to generate multiple arbitrarily spaced and of profiles of type B and/or C of FIG. 6.

The second solution consists of providing additional circuits capacitor C2 charging circuit 31, FIG. 7, of the piezoelectric open-circuit output voltage profile simulator embodiment 30 of FIG. 5, to allow simulation of multiple open-circuit voltage profiles as was previously described. In FIG. 7 only two such additional 31 are shown to be added, however, more such circuits may also be added as required, particularly if the generated open-circuit voltage profile events are required to occur with minimal or even almost no time spacing.

As previously indicated, there are numerous methods known in the art for implementing the "programmable timing and switching controller" activated switches SW1, SW2 and SW3 of the piezoelectric open-circuit output voltage profile simulator embodiment 30 and those in the added charging circuits 31 shown in FIG. 7, examples of which are presented below.

Figure 8B:
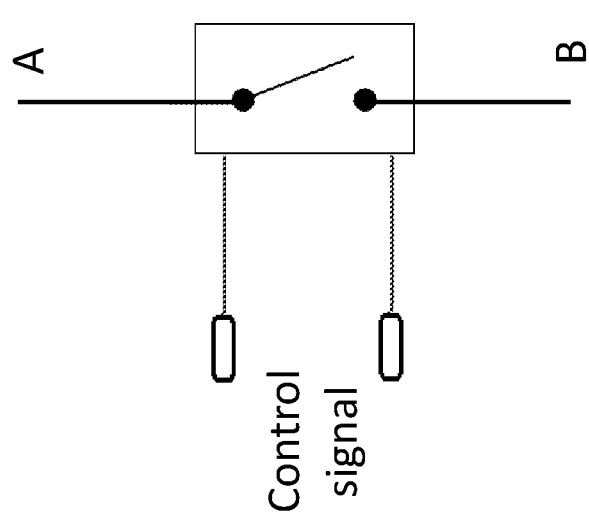
FIGS. 8A and 8B illustrate one possible implementation of the switches SW1 and SW3 of the embodiment of FIG. 5 and similar switches of added circuits 31 of FIG. 7 using an N-MOSFET.
Figure 8A:
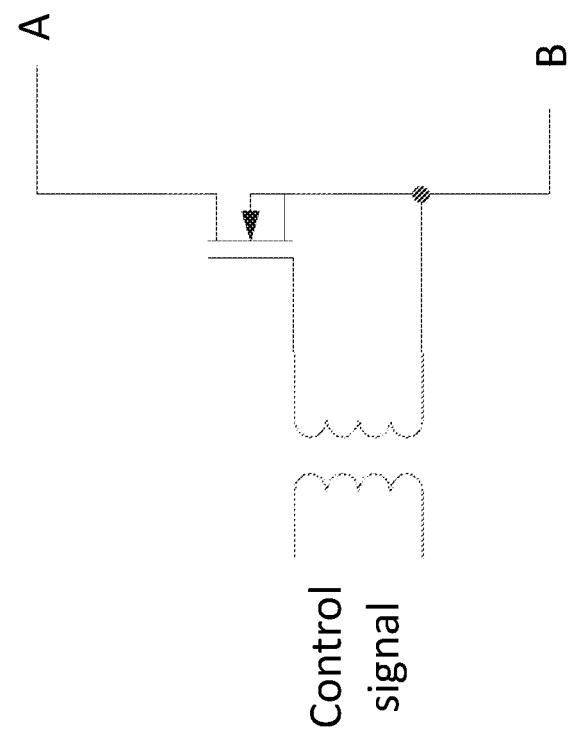

FIG. 8A shows one possible implementation of the switches SW1 and SW3 using an N-MOSFET. The control signal is provided by the simulator "programmable timing and switching controller". The equivalent representation of the switching device of FIG. 8A is shown in FIG. 8B.

Figure 9B:
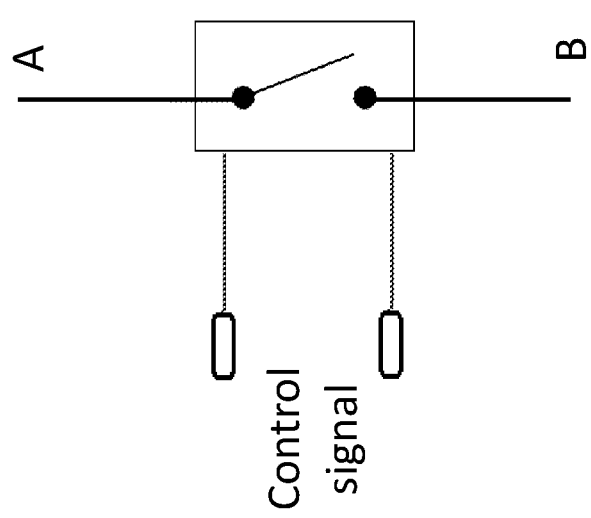
FIGS. 9A and 9B illustrate one possible implementation of the switch SW2 of the embodiment of FIG. 5 and similar switches of added circuits 31 of FIG. 7 using a P-MOSFET.
Figure 9A:
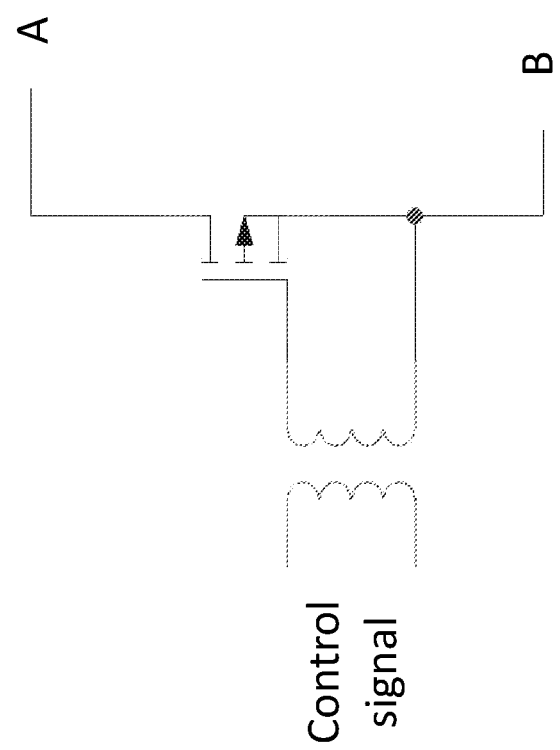

FIG. 9A shows one possible implementation of the switch SW2 using a P-MOSFET. The P-MOSFET should have a fast turn-on time, an example being part number IRFR825 by Infineon Technologies. The control signal is provided by the simulator "programmable timing and switching controller". The equivalent representation of the switching device of FIG. 9A is shown in FIG. 9B.

FIG. 10A shows another possible implementation of the switches SW1, SW2 and SW3 using a pair of N-MOSFET, which allows unidirectional current flow. A N-MOSFET should have a fast response turn-on time, an example being part number IPB50N10S3L-16 by Infineon Technologies. The control signal is provided by the simulator "programmable timing and switching controller". The equivalent representation of the switching device of FIG. 10A is shown in FIG. 10B.

It is appreciated by those skilled in the art that the profile of the generated open-circuit voltage curve of the capacitor C2, which simulates open-circuit voltage profile of the piezoelectric element, FIG. 1, during the rise time $t_r$ as can be seen in FIG. 6 is nearly (ideally) exponential. The same is true for the simulated open-circuit voltage profile during the indicated fall time, $t_f$. The time constants of the two exponential profiles are determined by the capacitances and resistances of the corresponding circuits as was previously described. For the circuit of FIG. 5, the time constants of the capacitor C2 charging and the capacitor discharging circuits, $\tau_r$ and $\tau_f$, respectively, are seen to be $$\tau_r = R1(C1+C2) \qquad (1)$$

$$\tau_f = R2C2 \qquad (2)$$

The capacitance of the capacitor C2 is, however, predetermined and has to be equal to that of the piezoelectric element, the open-circuit voltage output of which is to be simulated. When simulating open-circuit voltage output of piezoelectric elements that are subjected to firing setback or impact induced loading, the profile B or C, FIG. 2, with relatively fast rise time (and sometimes fall time) are usually desired.

To achieve faster rise time $t_r$ to a prescribed open-circuit voltage for the capacitor C2, the options are either an increase in the charged voltage of the capacitor C1 as well as its capacitance or a reduction in the resistance of the resistor R1, or both. With an increase in the initial charged voltage of the capacitor C1, a voltage threshold detector (comparator), shown as a dashed box 32 in FIG. 5, needs to be provided to limit the open-circuit voltage of the capacitor C2 to the prescribed level that is to be simulated. The above parameters must obviously be varied such that the said open-circuit voltage of the capacitor C2 is reached within the prescribed rise time of $t_r$.

To achieve faster time $t_f$ for discharging the capacitor C2, i.e., to bring the open-circuit voltage for the capacitor C2 to or close to zero, the only option available as indicated by the equation (2) is to decrease the resistance of the resistor R2.

Figure 11:
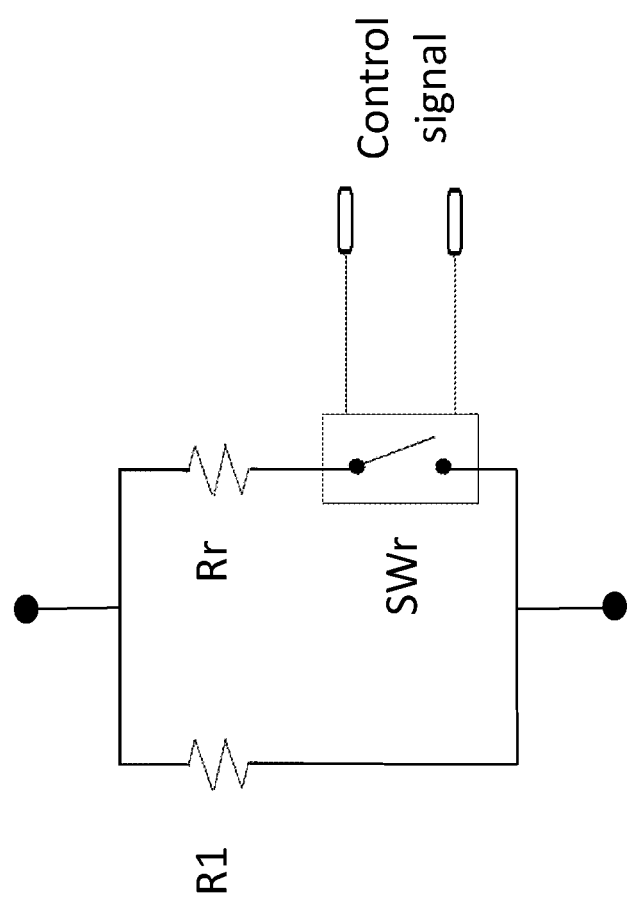
FIG. 11 illustrates a method of varying the rise time and discharge time of the simulated open-circuit voltage profile by varying the resistances in the corresponding circuits of the basic circuit of the first embodiment of the programmable piezoelectric element generated charge profile simulator of FIG. 5.

It is appreciated, however, by those skilled in the art that in both above processes of rendering the rise time $t_r$ and fall (discharge) time $t_f$ by reducing the resistances of the resistors R1 and R2, the corresponding currents passing through the circuit is increased. To minimize the said current levels, the said resistances may be made to be variable and drop from their high levels to lower levels over the indicated time durations time $t_r$ and $t_f$. This may, for example be achieved by sequentially bring on parallel resistors of appropriate resistances, such as shown in the circuit of FIG. 11. In FIG. 11, the resistance of the resistor R1 is shown to be reduced by closing the switch SWr from the resistance R1 to that of the equivalent resistance $R_{equi}$, equation (3), by the parallel resistor Rr.

$$\frac{1}{R_{equi}} = \frac{1}{R1} + \frac{1}{Rr} \quad (3)$$

The control signal for opening and closing the switch SWr is provided by the simulator "programmable timing and switching controller". It is appreciated by those skilled in the art that more than one parallel resistor Rr may be similarly provided to sequentially decrease the equivalent resistance $R_{equi}$.

It is also appreciated by those skilled in the art that by providing at least one and preferably more similar switch activated parallel resistors to the resistors R1 and R2, the open-circuit voltage profiles other than those indicated by B and C in FIG. 2, for example that of A or other more randomly shaped (but increasing during the rise time and decreasing during the discharge with near constant intermediate voltages) may also be generated. In all such cases, the switch opening and closing control signal is provided by the simulator "programmable timing and switching controller".

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. An open-circuit output voltage profile simulator comprising:
    a piezoelectric power source configured to provide an open-circuit output voltage;
    a first capacitor;
    at least first, second and third switches;
    a controller for controlling the first, second and third switches,
    a second capacitor couplable in parallel to the first capacitor under control of the second switch;
    a first resistor coupled in series between the first and second switches; and
    a second resistor coupled in series between the second and third switches;
    wherein the first capacitor is coupled to the power source through the first switch to control a charge profile of the simulator, and
    wherein the second and third switch are coupled to the first capacitor to control a discharge profile of the simulator.

2. The simulator of claim 1, wherein the third switch controls coupling of the second resistor in parallel with the second capacitor.

3. The simulator of claim 2, wherein the power source, the first and second capacitors, the first and second resistors, and the least first, second and third switches comprise a first open-circuit voltage profile generator, the simulator comprising at least one second open-circuit voltage profile generator couplable in parallel with the first open-circuit voltage profile generator under control of the controller.

4. The simulator of claim 1, wherein the first resistor comprises a plurality of first resistors selectively couplable in parallel at least in pairs under control of the controller.

5. The simulator of claim 1, wherein the second resistor comprises a plurality of second resistors selectively couplable in parallel at least in pairs under control of the controller.

6. The simulator of claim 1, wherein at least one of the first and second resistors comprise a plurality of resistors selectively couplable in parallel at least in pairs under control of the controller.

7. The simulator of claim 6, wherein the power source, the first and second capacitors, the first and second resistors, and the least first, second and third switches comprise a first open-circuit voltage profile generator, the simulator comprising at least one second open-circuit voltage profile generator couplable in parallel with the first open-circuit voltage profile generator under control of the controller.

8. The simulator of claim 1, comprising a resistive discharge path couplable to the first capacitor under control of the second and third switches to provide the discharge profile of the simulator.

9. The simulator of claim 1, wherein the power source, the first capacitor, and the least first, second and third switches comprise a first open-circuit voltage profile generator, the simulator comprising at least one second open-circuit voltage profile generator couplable in parallel with the first open-circuit voltage profile generator under control of the controller.

10. The simulator of claim 1, wherein at least one of the at least first, second and third switches comprises an N-MOSFET.

11. The simulator of claim 1, wherein at least one of the at least first, second and third switches comprises a P-MOSFET.

12. The simulator of claim 1, wherein at least one of the at least first, second and third switches comprises a pair of N-MOSFETs.

13. An open-circuit output voltage profile simulator comprising:
    a piezoelectric power source configured to provide an open-circuit output voltage;
    a first capacitor;
    at least first, second and third switches;
    a controller for controlling the first, second and third switches, and
    a resistive discharge path couplable to the first capacitor under control of the second and third switches to provide the discharge profile of the simulator;
    wherein the first capacitor is coupled to the power source through the first switch to control a charge profile of the simulator,
    wherein the second and third switch are coupled to the first capacitor to control a discharge profile of the simulator, and
    wherein the resistive discharge path comprises a resistor coupled in series between the first and second switches.

14. An open-circuit output voltage profile simulator comprising:
    a piezoelectric power source configured to provide an open-circuit output voltage;
    a first capacitor;
    at least first, second and third switches;

a controller for controlling the first, second and third switches, and a resistive discharge path couplable to the first capacitor under control of the second and third switches to provide the discharge profile of the simulator;

wherein the first capacitor is coupled to the power source through the first switch to control a charge profile of the simulator, wherein the second and third switch are coupled to the first capacitor to control a discharge profile of the simulator, and wherein the resistive discharge path comprises a resistor coupled in series between the second and third switches.

* * * * *